United States Patent [19]

Yamazaki

[11] 4,403,239

[45] Sep. 6, 1983

[54] MIS TYPE SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 218,722

[22] Filed: Dec. 22, 1980

[30] Foreign Application Priority Data

Dec. 26, 1979 [JP] Japan .............................. 54/169941

[51] Int. Cl.³ .................... H01L 27/14; H01L 29/78; H01L 45/00; H01L 49/02
[52] U.S. Cl. .......................................... 357/30; 357/2; 357/6; 357/23; 136/258
[58] Field of Search ................ 357/30, 23 TF, 46, 6, 357/2, 10; 136/258 PC, 258 AM

[56] References Cited

U.S. PATENT DOCUMENTS

| | | | |
|---|---|---|---|
| 3,493,767 | 2/1970 | Cohen | 357/6 X |
| 4,040,073 | 8/1977 | Luo | 357/23 TF X |
| 4,117,506 | 9/1978 | Carlson et al. | 357/6 X |

FOREIGN PATENT DOCUMENTS 54-169941 12/1979 Japan .

*Primary Examiner*—James W. Davie
*Assistant Examiner*—J. Carroll
*Attorney, Agent, or Firm*—Gerald J. Ferguson, Jr.; Joseph J. Baker

[57] ABSTRACT

A MIS type semiconductor photoelectric conversion device in which a first electrode, a first insulating or semi-insulating layer, a semiconductor layer, a second insulating or semi-insulating layer and a second electrode are formed in this order on a supporting member. The first electrode, the first insulating or semi-insulating layer and the semiconductor layer constitute a first MIS structure which uses the first insulating or semi-insulating layer as a first barrier. The semiconductor layer, the second insulating or semi-insulating layer and the second electrode constitute a second MIS structure which uses the second insulating or semi-insulating layer as a second barrier. The first and second MIS structures are formed on the supporting member in such a manner that they are placed one on the other mechanically and connected in series with each other electrically.

1 Claim, 2 Drawing Figures

MIS TYPE SEMICONDUCTOR PHOTOELECTRIC CONVERSION DEVICE

BACKGROUND OF THE INVENTION

1. Field of the Invention

The present invention relates to a MIS type semiconductor photoelectric conversion device.

2. Description of Prior Art

There has heretofore been proposed a PN or PIN junction semiconductor photoelectric conversion device.

The PN or PIN junction semiconductor photoelectric conversion device has such a construction that P and N type regions are formed in a semiconductor wafer or layer so as to provide therein a PN or PIN junction as a barrier. In this case, the P type region is formed by highly doping into the semiconductor wafer or layer a P type impurity which is potentially harmful to human health, and the N type region is also formed by high doping of an N type impurity which is similarly potentially harmful.

Accordingly, the PN or PIN type semiconductor photoelectric conversion device has the defect that its manufacture entails potential dangers to human safety and health.

Further, a Schottky junction semiconductor photoelectric conversion device has hitherto been proposed. The Schottky junction semiconductor photoelectric conversion device has such a construction that a metal of larger work function than a semiconductor wafer or layer is contacted therewith to form a Schottky junction as a barrier. The barrier by the Schottky junction has a high degree of temperature dependence; for example, when it is heated at 150° C. for a short time, the height of the barrier undergoes a change. Accordingly, the Shottky semiconductor photoelectric conversion device is not of practical use on the ground that the temperature dependence is large.

Moreover, a MIS type semiconductor photoelectric conversion device has been proposed. The conventional MIS type semiconductor photoelectric conversion device usually has a semiconductor wafer or layer, an insulating layer which is formed thereon to a thickness small enough to permit the passage therethrough of a tunnel current and is light transparent, a first electrode which is formed on the insulating layer and is light transparent and a second electrode which is formed on the semiconductor wafer or layer on the opposite side from the insulating layer. Since the MIS type semiconductor photoelectric conversion device of such a construction has a barrier formed by the insulating layer, when light is incident to the semiconductor wafer or layer from the side of the first electrode, a photoelectric conversion function is provided.

In such a MIS type semiconductor photoelectric conversion device, the barrier is formed by the insulating layer, not by the PN or PIN junction which is formed in the semiconductor wafer or layer, so that the manufacture of this device is free from such dangers as encountered in the manufacture of the PN or PIN junction semiconductor photoelectric conversion device. Further, since the barrier is formed by the insulating layer, not by the Schottky junction, the barrier has substantially no temperature dependence. Accordingly, the MIS type semiconductor photoelectric conversion device is more useful than the PN or PIN junction and the Schottky junction semiconductor photoelectric conversion devices.

In the abovesaid conventional MIS type semiconductor photoelectric conversion device, however, since the semiconductor wafer or layer is used as a supporting member for the insulating layer and the first and second electrodes, too, it must be formed thick; namely, an expensive material is required therefor in quantity. Further, such a construction introduces difficulties in the manufacture of this device. In addition, the first electrode lies on one of two opposing surfaces of the semiconductor wafer or layer serving as the supporting member and the second electrode lies on the other surface; hence, this causes inconvenience to the use of the device.

SUMMARY OF THE INVENTION

Accordingly, it is an object of the present invention to provide a novel MIS type semiconductor photoelectric conversion device which is based on the abovesaid conventional MIS type semiconductor photoelectric conversion device but is free from the defects mentioned above in connection therewith.

The MIS type semiconductor photoelectric conversion device has such a construction that a first electrode, a first insulating or semi-insulating layer, a semiconductor layer, a second insulating or semi-insulating layer and a second electrode are formed in this order on a supporting member. The first electrode, the first insulating or semi-insulating layer and the semiconductor layer constitute a first MIS structure which employs the first insulating or semi-insulating layer as a first barrier. Likewise, the semiconductor layer, the second insulating or semi-insulating layer and the second electrode make up a second MIS structure which uses the second insulating or semi-insulating layer as a second barrier. On the supporting member the first and second MIS structures are mechanically formed one on the other and electrically connected with each other.

Accordingly, in the MIS type semiconductor photoelectric conversion device of the present invention, since the barriers of the first and second MIS structures are each formed by the insulating or semi-insulating layer, not by a PN or PIN junction which is formed in the semiconductor layer, the manufacture of this device is free from such dangers as in the manufacture of the PN or PIN junction semiconductor photoelectric conversion device. Further, since the barriers are each formed not by the Schottky junction but by the insulating or semi-insulating layer, there is substantially no temperature dependence of the barriers.

Besides, the MIS type semiconductor photoelectric conversion device of the present invention has the supporting member and the semiconductor layer is not used as a supporting member, so that the semiconductor layer need not be formed thick and consequently an expensive material for the semiconductor layer is not required in quantities. In addition, the device of the present invention is obtained by forming the electrodes, the semiconductor layer and the insulating or semi-insulating layers on the supporting member, and hence the device can easily be manufactured. Moreover, since the first and second electrodes which are two electrodes of the device both lie on one of two opposing sides of the supporting member, the device is easy to use.

Other objects, features and advantages of the present invention will become more apparent from the following description taken in conjunction with the accompanying drawings.

DESCRIPTION OF THE PREFERRED EMBODIMENTS

Figure 1:
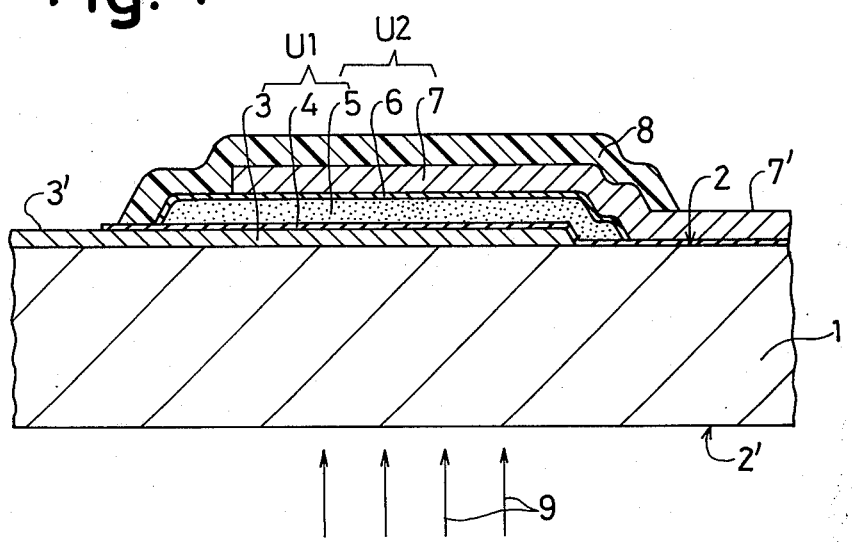
FIG. 1 is a schematic sectional view illustrating a first embodiment of the MIS type semiconductor photoelectric conversion device of the present invention.

In FIG. 1 there is shown a first embodiment of the MIS type semiconductor photoelectric conversion device of the present invention, which has a supporting member 1. The supporting member 1 is light transparent and has a flat major surface 2. The supporting member 1 may preferably be formed of an insulating material such, for example, as glass.

On the major surface 2 of the supporting member 1 is formed a first electrode 3, which has a relatively small thickness of 1000 to 5000 Å or a thickness ¼ the light wavelength and is also light semi-transparent. The first electrode 3 can be made a metal layer which is preferred to have a larger work function than a second electrode 7 described later and to be oxidation-resistant or to undergo limited oxidation such as, for example, platinum, tungsten, gold, molybdenum, tantalum, titanium, chromium or nickel. The reason for which this metal layer is preferred to be oxidation-resistant is to prevent that the first electrode 3 is exposed to the air to form thereon an unnecessary oxide layer before a first insulating or semi-insulating layer 4 described later is formed on the first electrode 3. The first electrode 3 may also be a metal oxide layer which fixedly has minus charges, for instance, an oxide layer of tin (Sn) or antimony (Sb). Further, the first electrode 3 may also be a P+ type semiconductor layer highly doped with a P type impurity. Moreover, the first electrode 3 may be made to have a two-layer structure which is formed by two of the above-said metal layer, metal oxide layer and P+ type semiconductor layer, or a three-layer structure including these three kinds of layers. In the case of using such a two-layer or three-layer structure, it is preferred that the oxidation-resistant metal layer serves as the surface layer of the first electrode 3. The reason is that the formation of an oxide layer on the surface of the first electrode 3 is avoided, as described above.

On the first electrode 3 is formed a first insulating or semi-insulating layer 4. The first insulating or semi-insulating layer 4 extends over that area on the major surface 2 of the supporting member in which the first electrode 3 is not formed, too. The first inslating or semi-insulating layer 4 is formed to a thickness small enough to permit the passage therethrough of a tunnel current, for example, 2 to 80 Å, preferably, 2 to 20 Å. The insulating or semi-insulating layer 4 may be formed by an insulating layer composed of a silicon nitride, represented by $Si_3N_4$, silicon carbide, alumina, zirconia or the like, or a semi-insulating layer composed of a silicon nitride represented by $Si_3N_{4-x}$ ($0<X<3$), a silicon oxide represented by $SiO_{2-y}$ ($0<Y<1$) or the like. Especially, it is preferred that the layer 4 is formed by a layer composed of a silicon nitride represented by $Si_3N_4$ or $Si_3N_{4-x}$ which is stable chemically. In practice, the layer of such a silicon nitride represented by $Si_3N_4$ or $Si_3N_{4-x}$ can be formed by the plasma CVD (Chemical Vapor Deposit) method using a gas mixture of a monosilane ($SiH_4$) gas and a nitride gas of $NH_3$.

On the first insulating or semi-insulating layer 4 is formed an intrinsic or non-impurity-doped semiconductor layer 5. The semiconductor layer 5 may preferably be formed of a non-single-crystal semiconductor such as an amorphous semiconductor, semi-amorphous semiconductor, polycrystalline semiconductor or the like, in particular, non-single-crystal silicon such as amorphous silicon, semi-amorphous silicon, polycrystalline silicon or the like. The semiconductor layer 5 made of amorphous or semi-amorphous silicon is especially practical. The semiconductor layer 5 can be formed on the insulating or semi-insulating layer 4 by the plasma CVD method using a mixture gas composed of a monosilane ($SiH_4$) gas as a silicon material gas and a helium (He) gas as a carrier gas in the ratio of 1 to 20–2000. With such a plasma CVD method, the silicon material deposited on the layer 4 becomes amorphous or semi-amorphous silicon by maintaining the pressure of the plasma atmosphere at 0.1 to 30 Torr and the surface temperature of the layer 4 in a temperature range of room temperature to 500° C. By making the mixture gas into a plasma at a distance from the surface of the layer 4 so that the silicon material may arrive at the layer 4 while being crystallized, the silicon material deposited on the layer 4 becomes semi-amorphous. The semi-amorphous silicon has a crystal structure or microcrystal structure with lattice distortion and is distinguished from the amorphous silicon. When the silicon material arrives at the layer 4 before being crystallized, the silicon material deposited on the layer 4 becomes amorphous silicon. The semiconductor layer 5 formed of the amorphous or semi-amorphous silicon by the abovesaid plasma CVD method has the construction in which dangling bonds of silicon (Si) are substituted with hydrogen (H). Therefore, the semiconductor layer 5 has a small number of recombination centers and hence has a high carrier mobility.

It is desirable that the semiconductor layer 5 is formed thin, for example, 0.5 to 5$\mu$, preferably 1.5 to 2$\mu$, so as not to produce the bimetallic effect due to different coefficients of thermal expansion of the semiconductor layer 5 and the supporting member 1. The semiconductor layer 5 may also be a layer doped with nitrogen (N), oxygen (O) or carbon (C). Such semiconductor layer 5 doped with nitrogen, oxygen or carbon can be obtained only by adding an $NH_3$, $N_2O$ or $CH_4$ gas to the mixture gas in the abovesaid plasma CVD method. The semiconductor layer 5 doped with nitrogen, oxygen or carbon has a large energy band gap of 1.5 to 2.5 eV as compared with that obtainable in the case where the layer 5 is not doped with such an element. The semiconductor layer 5 doped with nitrogen is excellent in heat resistance.

On the semiconductor layer 5 is formed a second insulating or semi-insulating layer 6 which extends to the side of the layer 5. The second insulating or semi-insulating layer 6 is formed to a thickness small enough to permit the passage therethrough of a tunnel current, for example, 2 to 80 Å, as is the case with the first insulating or semi-insulating layer 4. Further, the second insulating or semi-insulating layer 6 can be made an insulating layer of a silicon nitride represented by $Si_3N_4$, a silicon carbide, alumina, zirconia or the like, or a semi-insulating layer of a silicon nitride represented by $Si_3N_{4-x}$, a silicon oxide represented by $SiO_{2-y}$ or the like, as is the case with the first insulating or semi-insulating layer 4. In particular, it is preferred to use a silicon nitride represented by $Si_3N_4$ or $Si_3N_{4-x}$ which is stable chemically, as is the case with the first insulating or semi-insulating layer 4. In the case where the semiconductor layer 5 is formed of the non-single-crystal silicon, the layer of the silicon nitride represented by $Si_3N_4$ or $Si_3N_{4-x}$ can be formed by the plasma nitrification method according to which a plasma of a gas mixture composed of an $NH_3$ gas and a He gas in the ratio of 20~15 to 80~95 is contacted with the semiconductor layer 5 under a plasma atmosphere pressure of 0.1 to 10 Torr and a surface temperature of the layer 5 in the range of room temperature to 500° C., thereby nitrifying the surface of the semiconductor layer 5. The layer of the silicon nitride represented by $Si_3N_4$ or $Si_3N_{4-x}$ can also be obtained by the same plasma CVD method as is employed for the formation of the first insulating or semi-insulating layer 5 of such a silicon nitride.

On the second insulating or semi-insulating layer 6 is formed a second electrode 7 which extends over the first insulating or semi-insulating layer 4, too. The second electrode 7 can be made of a metal which has a smaller work function than the abovementioned first electrode 3, such as, for example, aluminum (Al), magnesium (Mg) or beryllium (Be). The second electrode 7 may also be made of a metal oxide layer which fixedly has positive charges, for example, an indium (In) oxide layer, or an N+ type semiconductor layer highly doped with an N type impurity. Moreover, the second electrode 7 may also be formed to have a two-layer structure which is composed of two of the metal layer, the metal oxide layer and the N+ type semiconductor layer mentioned above, or a three-layer structure including all of these three layers.

The facts that the second electrode 7 is the metal layer having a smaller work function than the first electrode 3, that the second electrode 7 is the metal oxide layer fixedly having plus charges, whereas the first electrode 3 is the metal oxide layer fixedly having minus charges, and that the second electrode 7 is N+ type semiconductor layer, whereas the first electrode 3 is the P+ type semiconductor layer, mean that the first and second electrodes 3 and 7 bear complementary relationship to each other. Because of such a complementary relationship between the first and second electrodes 3 and 7, electrons and holes which are yielded in the semiconductor layer 5 by the incidence thereto of light efficiently arrive at the first and second electrodes 3 and 7 and a photocurrent is led out therethrough.

On the second electrode 7 is formed a protective layer 8 which extends to those areas of the first and second insulating or semi-insulating layers 4 and 6 which are not covered with the second electrode 7, too, but leaving a part of that area of the second electrode 7 overlying the first insulating or semi-insulating layer 4. The protective layer may be formed of an epoxy, polyimid or other similar resins.

The above is the construction of the first embodiment of the MIS type semiconductor photoelectric conversion device of the present invention. With such an arrangement described above, the first electrode 3, the first insulating or semi-insulating layer 4 and the semiconductor layer 5 constitute a first MIS structure U1 which uses the first insulating or semi-insulating layer 4 as a first barrier. The semiconductor layer 5, the second insulating or semi-insulating layer 6 and the second electrode 7 make up a second MIS structure U2 which employs the second insulating or semi-insulating layer as a second barrier. The first and second MIS structures are formed on the supporting member 1 one on the other mechanically but connected in series with each other electrically. And in this case, the supporting member 1, the first electrode 3 and the first insulating or semi-insulating layer 4 are light transparent.

Accordingly, with the arrangement of the first embodiment of the MIS type semiconductor photoelectric conversion device of the present invention shown in FIG. 1, it is possible to obtain the same photoelectric conversion function as that of the conventional MIS type semiconductor photoelectric conversion device by applying light 9 to the semiconductor layer 5 from the side of the main surface 2' opposite from the main surface 2 of the supporting member 1. Consequently, a photocurrent of a value corresponding to the intensity of light incident to the semiconductor layer 5 can be supplied to the outside through the first and second electrodes 3 and 7. A region 3' of the first electrode 3 which is not covered with the insulating or semi-insulating layer 4 and a region 7' of the second electrode 7 which is not covered with the protective layer 8 both form terminals for leading out the photocurrent.

In this case, since the first embodiment of the present invention has the two MIS structures U1 and U2 and since they are electrically connected in series with each other, the photocurrent of the value corresponding to the intensity of the incident light can be provided in a large value to the outside via the first and second electrodes 3 and 7. Hence the present embodiment is high in its photoelectric conversion efficiency. According to my experiments, a photoelectric conversion efficiency of 8 to 13% was obtained with this MIS type semiconductor photoelectric conversion device. Further, since the first and second MIS structures U1 and U2 are electrically connected with each other, an open voltage between the first and second electrodes 3 and 7 is large and consequently this device is convenient to use. According to my experiments, when the open voltages of the first and and second MIS structures U1 and U2 were each 0.4 to 0.5 V, an open voltage of 0.85 to 0.95 V was obtained between the first and second electrodes 3 and 7.

The barriers of the first and second MIS structures U1 and U2 are respectively formed by the insulating or semi-insulating layers 4 and 6; namely, the barriers are each formed by the insulating or semi-insulating layer, not by the PN or PIN junction provided in the semiconductor layer. Accordingly, the manufacture of this device is free from such dangers as experienced in the fabrication of conventional PN or PIN junction semiconductor photoelectric conversion device. Further, since the barriers of the first and second MIS structures U1 and U2 are both formed by the insulating or semi-insulating layers, not by the Schottky junctions, the device of the present invention has substantially no temperature dependence of the barriers and hence has a stable photoelectric conversion function.

Moreover, according to the arrangement of the first embodiment of the present invention, the supporting member 1 is provided and the semiconductor layer does not serve as a supporting member, too, so that the semiconductor layer need not be formed thick. In other words, the expensive material for the semiconductor layer is not required in quantity, and consequently the device of the present invention can be produced at low cost. In addition, since the device of the present invention can be obtained by forming electrodes 3 and 7, the insulating or semi-insulating layers 4 and 6 and the semiconductor layer 5 on the supporting member 1, the device can be manufactured with ease.

Furthermore, according to the arrangement of the first embodiment of the present invention, the first and second electrodes 3 and 7 for leading out the photocurrent lie only on one surface 2 of the supporting member 1, and this is convenient when the device is put to practical use.

Figure 2:
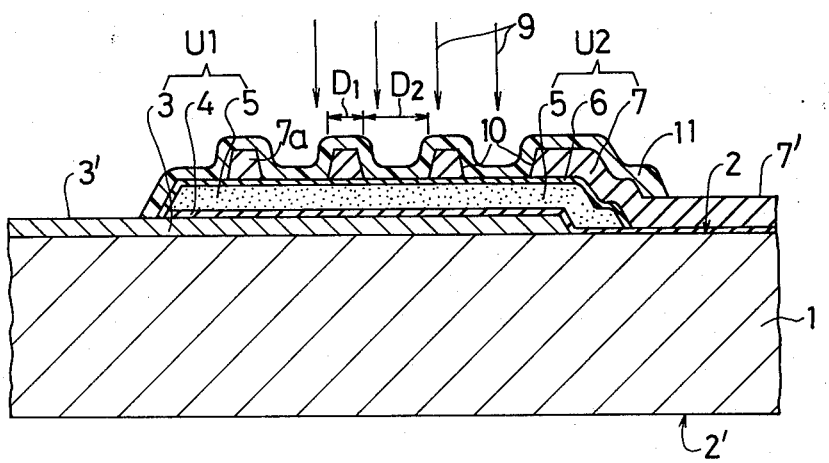
FIG. 2 is a schematic sectional view illustrating a second embodiment of the MIS type semiconductor photoelectric conversion device of the present invention.

Next, a description will be given, with reference to FIG. 2, of a second embodiment of the MIS type semiconductor photoelectric conversion device of the present invention. In FIG. 2, the parts corresponding to those in FIG. 1 are identified by the same reference numerals and no detailed description will be repeated. The second embodiment is identical in construction with the first embodiment of FIG. 1 except in the following points. The supporting member 1 is non-light-transparent and can be formed by a ceramic plate as of alumina, ferrite or the like, or a plate of glass epoxy resin, epoxy resin or the like. The first electrode 3 is identical with that employed in the first embodiment but need not always be light transparent. The first insulating or semi-insulating layer 4 is also the same as that used in FIG. 1 but need not always be light transparent, either. The semiconductor layer 5 is identical with that utilized in the first embodiment of FIG. 1.

The second insulating or semi-insulating layer 6 is one that is formed in the same manner as in the case of FIG. 1, but this layer 6 is light transparent in the second embodiment. The second electrode 7 is a layer formed in the same way as in the case of FIG. 1 but, in this embodiment, the second electrode 7 has a comb- or grid-like pattern so that light-passing windows 10 of the comb- or grid-like pattern may be formed. The width $D_1$ of each element 7a of the second electrode 7 may be, for example, 5 to 10μ. The width $D_2$ of each window 10 may be, for instance, 50 to 200μ.

The protective layer 8 in FIG. 1 is substituted by an anti-reflection layer 11 which is formed on the second insulating or semi-insulating layer 6 to cover the comb- or grid-like pattern electrode 7. The anti-reflection layer 11 may be formed by a silicon nitride layer.

The above is the arrangement of the second embodiment of the present invention. The second embodiment is identical in construction with the first embodiment of FIG. 1 except in the abovesaid points. Accordingly, the second embodiment also has the same construction as the first embodiment in that the first MIS structure U1 formed by the first electrode 3, the first insulating or semi-insulating layer 4 and the semiconductor layer 5 and the second MIS structure U2 formed by the semiconductor layer 5, the second insulating or semi-insulating layer 6 and the second electrode 7 are constituted on the supporting member 1.

In the second embodiment, however, the supporting member 1 is non-light-transparent, whereas the second insulating or semi-insulating layer 6 is light transparent, and the second electrode 7 has the light-passing windows 10.

Accordingly, in the second embodiment of the present invention, by applying the light 9 to the semiconductor layer 5 via the anti-reflection layer 11 from the side of the second electrode 7, there can be obtained the same photoelectric conversion function as is obtainable with the first embodiment of FIG. 1. As will be appreciated from the above, the second embodiment also exhibits the same excellent features as those described previously in conjunction with FIG. 1, though not described in detail.

The foregoing description should be construed as merely illustrative of the present invention and should not be construed in a limiting sense. For example, in the first embodiment of FIG. 1, it is possible to employ such an arrangement that the protective layer 8, the second electrode 7 and the second insulating or semi-insulating layer 6 are formed as light transparent layers, thereby to permit the incidence of light from the side of the second electrode 7, too. Similarly, in the second embodiment of FIG, 2 it is also possible to adopt such an arrangement that the supporting member 1, the first electrode 3 and the first insulating or semi-insulating layer 4 are light transparent to permit the incidence of light from the side of the major surface 2' of the supporting member 1 on the opposite side from the electrode 3. Further, in the second embodiment of FIG. 2 the anti-reflection layer 11 can also be substituted with a light transparent electrode. Further, the semiconductor layer 5 need not always be formed of silicon but may also be made of the I-VI and II-VI group compound semiconductors such as CdS, $Cu_2O$, CdTe and so forth and the III-V group compound semiconductors such as GaAlAs, GaP and so on.

It will be apparent that many modifications and variations may be effected without departing from the scope of the novel concepts of this invention.

What is claimed is:

1. An MIS type semiconductor photoelectric conversion device comprising:
   a supporting member;
   a first electrode formed on the supporting member;
   a first insulating or semi-insulating layer permitting the passage therethrough of a tunnel current and formed as a first barrier on the first electrode;
   a semiconductor layer formed on the first insulating or semi-insulating layer;
   a second insulating or semi-insulating layer permitting the passage therethrough of the tunnel current and formed as a second barrier on the semiconductor layer; and
   a second electrode formed on the second insulating or semi-insulating layer;
   wherein the first electrode, the first insulating or semi-insulating layer and the semiconductor layer constitute a first MIS structure; the semiconductor layer, the second insulating or semi-insulating layer and the second electrode constitute a second MIS structure; and the first and second MIS structures are formed of the supporting member one over the other mechanically and connected in series with each other electrically.

* * * * *